(12) United States Patent
Zoorob et al.

(10) Patent No.: US 8,610,136 B2
(45) Date of Patent: Dec. 17, 2013

(54) THERMALLY OPTIMISED LED CHIP-ON-BOARD MODULE

(75) Inventors: Majd Zoorob, Southampton (GB); Thomas David Matthew Lee, Basingstoke (GB)

(73) Assignee: PhotonStar LED Limited, Hants (GB)

( * ) Notice: Subject to any disclaimer, the term of this patent is extended or adjusted under 35 U.S.C. 154(b) by 183 days.

(21) Appl. No.: 13/057,549

(22) PCT Filed: Aug. 5, 2009

(86) PCT No.: PCT/GB2009/001929
§ 371 (c)(1),
(2), (4) Date: Feb. 4, 2011

(87) PCT Pub. No.: WO2010/015825
PCT Pub. Date: Feb. 11, 2010

(65) Prior Publication Data
US 2011/0133224 A1     Jun. 9, 2011

(30) Foreign Application Priority Data
Aug. 5, 2008  (GB) .................................. 0814318.2

(51) Int. Cl.
*H01L 33/64* (2010.01)

(52) U.S. Cl.
USPC  257/88; 257/99; 257/E33.056; 257/E33.075; 438/28

(58) Field of Classification Search
None
See application file for complete search history.

(56) References Cited

U.S. PATENT DOCUMENTS

| | | | |
|---|---|---|---|
| 6,770,498 B2 | 8/2004 | Hsu | |
| 6,884,646 B1 | 4/2005 | Wu et al. | |
| 7,176,502 B2 | 2/2007 | Mazzochette et al. | |
| 7,196,354 B1 | 3/2007 | Erchak et al. | |
| 7,367,692 B2 * | 5/2008 | Maxik | 362/307 |

(Continued)

FOREIGN PATENT DOCUMENTS

| | | |
|---|---|---|
| DE | 10 2005 030761 | 1/2007 |
| WO | 2006/103596 | 10/2006 |
| WO | 2007/086668 | 8/2007 |

OTHER PUBLICATIONS

International Search Report and Written Opinion of corresponding International Application No. PCT/GB2009/001929, dated Dec. 16, 2009.

(Continued)

*Primary Examiner* — Wensing Kuo
(74) *Attorney, Agent, or Firm* — Renner, Otto, Boisselle & Sklar, LLP

(57) ABSTRACT

A LED Chip-on-Board (COB) module comprises a plurality of LED die arranged on a substrate in one or more radially concentric rings about a center point such that each LED die is azimuthally offset from neighboring LED die. The module includes thermal conduction pads each having lateral dimensions at least as large as the combined lateral dimensions of the LED die attached to it and a total surface area at least five times larger than the total surface area of all the LED die attached to it. At the same time, the total light emission area of the module is no greater than four times larger than the combined total surface emission area of all the individual LED die disposed on the substrate. A variety of configurations are possible subject to these criteria, which permit good packing density for enhanced brightness while ensuring optimal heat transfer. A method of manufacturing the module is also provided.

18 Claims, 7 Drawing Sheets

(56) References Cited

U.S. PATENT DOCUMENTS

| | | |
|---|---|---|
| 2006/0043546 A1 | 3/2006 | Kraus |
| 2006/0091409 A1 | 5/2006 | Epler et al. |
| 2006/0091415 A1 | 5/2006 | Yan |
| 2006/0154389 A1 | 7/2006 | Doan |
| 2006/0292747 A1 | 12/2006 | Loh |
| 2007/0080438 A1 | 4/2007 | Yamanaka et al. |
| 2007/0090375 A1 | 4/2007 | Kobilke |
| 2008/0035947 A1 | 2/2008 | Weaver et al. |
| 2008/0084699 A1 | 4/2008 | Park et al. |
| 2008/0170396 A1* | 7/2008 | Yuan et al. ............ 362/244 |

OTHER PUBLICATIONS

UK Search Report of corresponding GB Application No. 0814318.2, dated Dec. 8, 2008.

* cited by examiner

THERMALLY OPTIMISED LED CHIP-ON-BOARD MODULE

This application is a national phase of International Application No. PCT/GB2009/001929 filed Aug. 5, 2009, and published in the English language as WO 2010/015825 on Feb. 11, 2010.

FIELD OF THE INVENTION

The present invention relates to a low thermal resistance solid-state light emitting module and a method of manufacturing the same.

BACKGROUND TO THE INVENTION

Light emitting devices and diodes are based on a forward biased p-n junction. LEDs have recently reached high brightness levels that have allowed them to enter into new solid state lighting applications as well as replacements for high brightness light sources such as light engines for projectors and automotive car headlights. These markets have also been enabled by the economical gains achieved through the high efficiencies of LEDs, as well as reliability, long lifetime and environmental benefits. These gains have been partly achieved by use of LEDs that are capable of being driven at high currents and hence produce high luminous outputs while still maintaining high wall plug efficiencies.

Solid state lighting applications require that LEDs exceed efficiencies currently achievable by alternative incandescent and fluorescent lighting technologies. The efficiencies of LEDs can be quantified by three main factors, internal quantum efficiency, injection efficiency, and the extraction efficiency. The latter being the basis for the present invention. Several other factors affect the overall efficiency of solid state lighting applications such as phosphor conversion efficiency and electrical driver efficiency. However, these are beyond the scope of the present invention.

It is also of particular interest to maintain the small format light emitting device at a low temperature during operation as the junction temperate of the LED dramatically affects both its life time and its overall efficiency. As a basic rule, every 10° C. increase (above 25° C.) in junction temperature reduces the life time of the LED by 10 kHrs for a Galium Nitride LED. It is also a consequence of the increase of the junction temperature that the overall efficiency of a state of the art vertical type LED drops, for example, increasing the junction temperature from 40° C. to a 70° C. will reduce the efficacy of the LEDs by more than 10%. It is noted that this effect increasingly becomes nonlinear in behaviour. Thus, appropriate packaging solutions need to be developed to ensure performance is maintained and the operating temperature of the light emitting device is maintained for a given change in the junction temperature as well as the ambient temperature.

The thermal resistance of a package is the measure of how well a package can conduct heat away from the junction of the LED. Current state of the art modules have a thermal resistance of between 4 and 8 K/W.

Many methods have been successfully employed to improve the thermal resistance of LED module packages. These include the use of shaped metal lead frames in array formats (in U.S. Pat. No. 6,770,498), the use of bulk Aluminium Nitride ceramic tiles with electrical tracking on top (in published U.S. Patent Application 2006/0091415A1) and the use of flip chip LEDs onto tracked ceramic tiles with through vias to allow surface mounting (in published U.S. Patent Application 2006/0091409A1).

The LEDs themselves have been engineered to produce a low thermal resistance path from the junction to the package where the heat is spread, such as the flip chip approach described above (published U.S. Patent Application 2006/0091409A1) where the junction is very close to the package.

Another approach to provide LEDs with high current and thermal driving capabilities the vertical type n-p contact configuration in GaN material systems has been recently adopted an example of which has been disclosed in U.S. Pat. No. 6,884,646 and published U.S. Patent Application 2006/0154389A1. These use high thermal conductivity materials such as Copper to provide low thermal resistance from the junction to the package. More recently, improvements to these vertical type LED designs with respect to optical extraction performance promise even greater wall plug efficiency chips as described in UK patent applications 0704120.5 and 0714139.3.

U.S. Pat. No. 7,196,354 describes the introduction of a thermally conductive region in contact with the wavelength converting region and which comprises a material having a thermal conductivity greater than that of the wavelength converting element. In this case the thermally conductive material is optically non-transmissive designed to reflect the wavelength converted light. This leads to cumbersome additional reflective surfaces being introduced to re-direct and emit the wavelength converted light. Additionally, a larger light emitting package is required to accommodate the additional reflective thermally conductive surfaces. It is also not desirable to introduce reflective surfaces in the path of the emitted light as this may introduce optical loss affecting the overall efficiency of the LED. Additionally, any optical loss will ultimately lead to increased phonon vibrations leading to increased thermal load in the device.

Recently, the metal core printed circuit board (MCPCB) has been successfully employed for the implementation of LED Chip-on-Board (COB) lighting modules for improved thermal dissipation as well as reduce manufacturing cost. Different forms of LED COB modules have been proposed, for example in published U.S. Patent Application 2008/0084699, U.S. Pat. No. 7,176,502 and published International patent application WO 2007/086668 A1. These include secondary optics to provide modified far field emission from the LED module.

Additionally, high-thermal Conductivity MCPCB has also been proposed in UK patent applications 0716386.8. These employ electrical isolation layer having high thermal conductivity properties improving the vertical thermal dissipation properties of the circuit board.

Notwithstanding the developments in this field, there is still a need for a low cost LED Chip-on-Board type module that is optimised for improved thermal properties and enhanced brightness.

SUMMARY OF THE INVENTION

According to a first aspect of the present invention, a LED Chip-on-Board (COB) module comprises:
    a high thermal conductivity substrate;
    an electrical-tracking layer having a plurality of thermal conduction pads disposed on the substrate; and,
    a plurality of LED die disposed on the substrate, at least one of the LED die being attached to each of the thermal conduction pads, wherein:
each thermal conduction pad has lateral dimensions at least as large as the combined lateral dimensions of the LED die attached to it and the total surface area of each conduction pad is at least five times larger than the total surface area of all the LED die attached to said pad;
the plurality of LED die are arranged in one or more radially concentric rings about a centre point such that each LED die is azimuthally offset from neighbouring LED die, wherein a boundary of the outer ring of LED die defines a total light emission area of the plurality of LED die when activated; and,
said total light emission area is no greater than four times larger than the combined total surface emission area of all the individual LED die disposed on the substrate.

In this way, the present invention provides a light emitting diode (LED) Chip-on-Board (COB) module with improved thermal resistance. The LED COB module provides a high packing density of LED die for high brightness applications while maintaining efficient heat dissipation for high power applications. The azimuthal offset of neighbouring LED die ensures that any radially-outward projecting construction line from the centre of the LED cluster and passing through any LED die centre does not coincide with any another LED die.

Preferably, the LED COB module comprises at least six LED die. More preferably at least fifteen LED die and even more preferably at least thirty three LED die.

In one embodiment, the LED COB module comprises at least two LED die affixed to the same thermal conduction pad. Further LED die may be attached to a given thermal conduction pad, providing the requirements for the size of the conduction pad and the total emission area are satisfied.

In a particular embodiment it is preferred that there are at least six pairs of LED die arranged in a single concentric ring.

In another embodiment, the LED COB module comprises at least sixteen die arranged in three concentric rings.

When the LED are arranged in a plurality of rings, a plurality of neighbouring LED die may be attached to regions of a common thermal conduction pad which extend radially inwards by differing amounts.

In another preferred embodiment, each LED die is rotated about its axis by a pre-defined rotational symmetry angle relative to a radial line extending from the centre point of the one or more concentric radial rings and through the centre of the LED die.

Preferably, the LED COB comprises a high thermal conductivity substrate comprising a material selected from a group which includes Copper, Copper alloy, Copper Tungsten, Aluminium, AlN, Aluminium Oxide, Silicon Carbide, Carbon Fibre or composites, and graphite.

Preferably, the electrical tracking layer of the LED COB module comprises one or more material materials selected from a group which includes Copper, alloys of Copper, Ag, Ag alloys, Au, Au alloys, W, Ni, Ti and Aluminium.

Preferably, the LED COB module further comprises one or more pairs of electrical contact pads disposed on the substrate and connected to the electrical tracking layer, wherein upon activation each pair of contact pads activates a predefined group of LED die.

In one arrangement, the LED dies are electrically connected in series. In another arrangement, groups of LED dies are electrically connected in parallel, each group comprising a plurality of LED dies electrically connected in series.

Preferably, the electrical tracking layer comprises at least two regions electrically isolated from one another.

In one embodiment, the LED COB module further comprises an encapsulant disposed on the surface of the LED die.

The LED COB module may also comprise a wavelength converting element (WCE) at least partially disposed on the surface of the LED die.

The LED COB module may also comprise a reflector cup affixed to the surface of the substrate with the LED die arranged to reside inside the reflector cup.

According to a second aspect of the present invention, a method of manufacturing a LED COB module according to the first aspect of the present invention comprises the steps of:
providing a substrate having an isolation layer disposed on an upper surface of the substrate;
pre-determining a concentric radial arrangement of a plurality of LED die, wherein:
the plurality of LED die are arranged in one or more radially concentric rings about a centre point such that each LED die is azimuthally offset from neighbouring LED die, wherein a boundary of the outer ring of LED die defines a total light emission area of the plurality of LED die when activated; and,
said total light emission area is no greater than four times larger than the combined total surface emission area of all the individual LED die disposed on the substrate;
pre-determining an electrical tracking layout having thermal conduction pads, wherein:
each thermal conduction pad has lateral dimensions at least as large as the combined lateral dimensions of the LED die to be attached to it and the total surface area of each conduction pad is at least five times larger than the total surface area of all the LED die to be attached to said pad;
forming the pre-determined electrical tracking layout having the thermal conduction pads on an upper surface of the isolation layer;
attaching the plurality of LED die to the conductions pads according to the pre-determined concentric radial arrangement; and,
connecting a top contact pad of each LED die to the electrical tracking or conduction pad.

Thus, the present invention provides a LED COB module with an arrangement of LED die that is optimised for improved thermal properties and enhanced brightness. This is achieved by means of a radial arrangement of LED die with corresponding thermal conduction pads and appropriate electrical connections. A variety of arrangements is possible subject to certain criteria which permit good packing density whilst ensuring optimal heat transfer. A method of manufacturing the module is also provided.

BRIEF DESCRIPTION OF THE DRAWINGS

Examples of the present invention will now be described in detail with reference to the accompanying drawings, in which:

FIG. 2b shows a schematic circuit diagram of the LED COB module shown in FIG. 2a;

FIG. 3b shows a schematic circuit diagram of the LED COB module shown in FIG. 3a;

FIG. 4b shows a schematic circuit diagram of the LED COB module shown in FIG. 4a;

FIG. 5b shows a schematic circuit diagram of the LED COB module shown in FIG. 5a.

DETAILED DESCRIPTION

Figure 1:
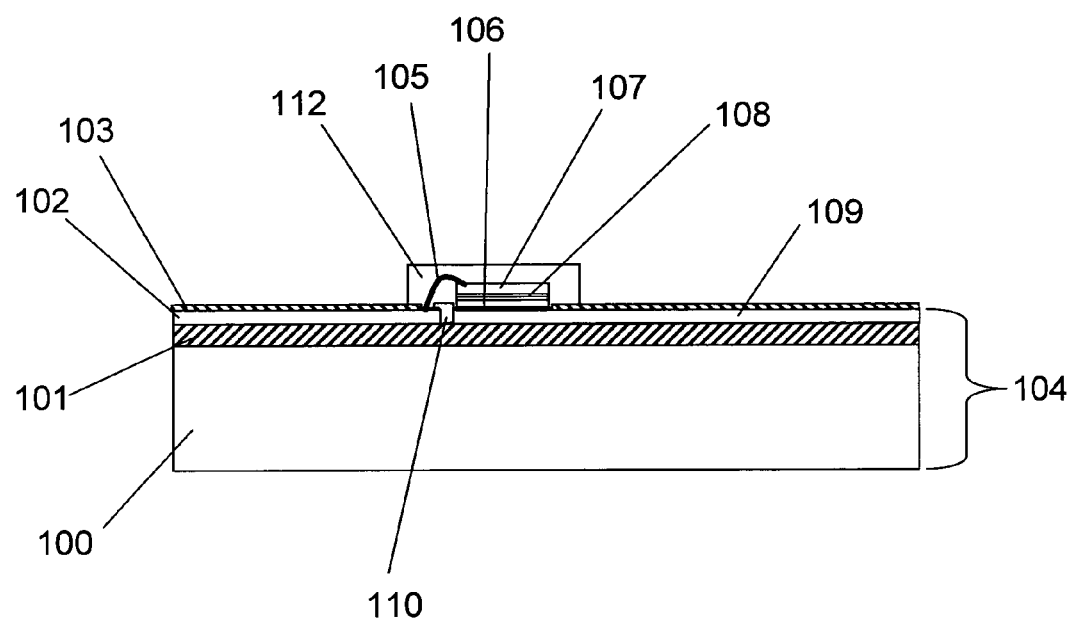
FIG. 1 shows a schematic cross sectional view of an example LED COB module of the present invention.

The thermal conductivity of a material can be defined according to the following expression:

$$k = \frac{Q}{t} \times \frac{L}{A \times \Delta T} \quad (1)$$

where the quantity of heat, Q, transmitted in time t through a thickness L, in a direction normal to a surface of area A, due to a temperature difference $\Delta T$, under steady state conditions and when the heat transfer is dependent only on the temperature gradient.

In order to reduce the temperature difference across a defined region in a submount a material with an increased thermal conductivity can be employed, additionally a thinner material may also be implemented. Table 1 contains a list of thermal conductivities for common materials used in semiconductors, light emitting devices, and LED packaging.

TABLE 1

| Material | Thermal Conductivity W/(m · K) | CTE ($10^{-6}$/K) @ 20° C. |
|---|---|---|
| Alumina | 18 | 6.9 |
| Aluminum Nitride | 170 | 4.7 |
| AuSn solder | 57 | 16 |
| Copper | 400 | 17 |
| Aluminium | 237 | 24 |
| Tungsten | 160 | 4.3 |
| Silver | 419 | 18 |
| Gold | 318 | 14 |
| GaN | 130-225 | 3.1 |
| Sapphire | 40 | 8.4 |
| Silicon | 150 | 2.6 |
| Diamond | 900-1900 | 1.18 |

The thermal resistance is the inverse of thermal conductivity. If a Gallium Nitride LED is considered, which has a thermal conductivity of between 130 to 230 W/(m·K), then the deposited substrate materials for the submount should be chosen to be no worse than these otherwise the overall thermal resistance will be increased. As the junction temperature of the LED is sensitive to increases in temperature, the materials constituting the submount should be chosen carefully to ensure the thermal resistance is minimised. An ideal material for thermal performance would be a diamond heat spreader and heat sink. However, the cost would be prohibitive for most applications.

Table 1 also contains the coefficient of thermal expansion (CTE) for the same materials. Ensuring good matches between the submount materials and the semiconductor light emitting device material eliminates stress build up during soldering. This will improve the overall reliability of the light emitting module when high power densities are injected into the LED or laser diode device.

The object of the invention is to provide a LED module comprising a high luminous output semiconductor LED and a chip-on-board (COB) substrate having a low thermal resistance from LED junction to base of substrate or submount and capable of withstanding a continuous high drive current and high power densities while still maintaining long lifetime and controlled colour temperatures with minimal degradation in characteristics of the LED. The LED module may further comprise a wavelength-converting element (WCE) disposed on the LED die to give rise to white light emission or other colour chromaticity emission. The WCE is capable of absorbing light generated from the LED at a specific wavelength and re-emitting light having a different wavelength.

The invention can be incorporated in a light emitting device formed of any semiconductor material system such as, but not restricted to, InGaN, InGaP, InGaAs, InP, and ZnO. A GaN based light emitting diode (LED) having an epitaxial layer formed on a sapphire substrate is used as an example for the present invention. However, the invention is not restricted to epitaxial layers grown on sapphire and may include Si, SiC, Ge, native free-standing GaN, AlN, LiAlO or any other growth and substrate technology. Additionally, an LED with either a vertical or lateral current path may be employed for the present invention. In the vertical case, the electrical current through the p- and n-doped materials is applied via substantially parallel contacts that allows current to flow through a vertical direction of the LED structure.

In the first aspect of the present invention an LED COB module is proposed. FIG. 1 shows the cross section of such a LED COB module. A single vertical LED die, 107, is affixed to an electrical tracking layer 109 and is supported on a thermally conductive submount 100. The LED die is attached using any suitable method such as, but not limited to, die bonding using eutectic, soldering, adhesive (such as epoxy, resin or encapsulant), glass or silver glass, as shown at 106. Due to the vertical electrical conduction path of the LED die, the die bond is designed to form an ohmic contact with the tracking layer 109 and the p-contact layer of the LED.

In a preferred example of the invention, a vertical LED is employed due to the proximity of the active region, 108, to the electrical tracking layer. This provides a much reduced temperature gradient from the active region to the high thermal conductivity electrical tracking due to greatly reduced thermal propagation distance, t. For example, a reduction in t from approximately 4 to 5 microns down to 100 to 600 nm within the LED.

It is another object of the invention that layer 106 is thermally conductive and designed to be as thin as possible. Preferably, the layer thickness is less than 20 microns, and more preferably less than 10 microns, in order to achieve minimal thermal resistance. Preferred thermal conductivity for the layer 106 ranges between 5 W/m·K and 40 W/m·K, and is preferably greater than 25 W/m·K.

The n-contact pad residing on the top surface of the LED die is attached to the electrical track layer 102. Application of power to the LED die using the ohmic contacts activates the LED and allows the generation of light from the active region. The n-contact pad of the LED is attached to 102 by use of a method such as, but not limited to, wire bonding or shadow deposition or sputtering of an electrically conductive material between the two regions. The two regions 102 and 109 of the electrical tracking layer are electrically isolated by means of element 110 to avoid electrical shorting.

The board substrate material 100 is preferably a metal substrate such as, but not restricted to, Copper, alloys of Copper, Copper Tungsten, Aluminium and layers of conductive metals or layers of graphite. The substrate can be any metal or alloy that has high thermal conductivity, preferably in excess of 130 W/(m·K). Alternatively, the substrate may further comprise of a ceramic or composite material such as but not restricted to AlN, $Al_2O_3$, SiC, Carbon Fibre or composites, graphite. Typical thickness of substrate ranges between 0.5 mm and 3 mm.

The electrical tracking layer material 102 and 109, as well as regions 201, is preferably a high thermal and electrical conduction material such as a metal. This can be any metal or alloy that has high thermal conductivity (in excess of 130 W/(m·K)) such as, but not restricted to, Copper, alloys of Copper, Ag, Ag alloys, Au, Au alloys, W, Ni, Ti or Aluminium. The tracking layer may further comprise of a multi-layer of metals, with some of the first layers being employed for improvement of adhesion of metals to the underlying isolation layer, subsequent layers being employed for improved thermal and electrical conductivity, and the final layers in the multilayer system being employed for improved environmental resistance as well as improved wire bonding and soldering capability. Typical thickness of tracking layers range between 2 microns and 300 microns, preferably greater than 30 microns, more preferably greater than 70 microns.

An electrical insulating layer, 101, having good thermal conduction is disposed between the substrate 100 and the electrical tracking layer 102 and 109. The layer can range in thickness from 100 nm to 200 microns, such as 2 microns, 75 microns, 125 microns and 175 microns. Layer 101 may comprise, but is not restricted to, a polymer, resin, polymer/ceramic hybrid, ceramic, crystalline deposited insulator or amorphous deposited insulator such as metal oxides and nitrides. Any suitable high thermal conductivity insulating layer may be employed, including (but not limited to) those described in UK patent application 0716386.8.

Following the screen printing of (or other deposition method of) the electrical tracking layers, a dielectric passivation layer, 103, is applied to protect the tracking layer from the environment and any potential damage. The electrical tracking is designed to form a circuit to enable the electrical activation of all the semiconductor LEDs on the COB module and the subsequent generation of light.

The LED 107 is further preferably encapsulated with a suitable encapsulant such as non-conducting epoxy or silicone encapsulant 112. This can be shaped or textured or disposed in a reflector cup to allow maximum light extraction from the LED module. The encapsulation is additionally provided for protection of the LED and wire bonds. Lenses may also be used in addition, although this is not depicted here, as this is not the focus of the present invention.

In order to determine the temperature difference between the upper and lower surface of layer in the LED COB stack, the following pseudo 1D equation may be employed:

$$\Delta T_{upper-lower} = \frac{P_{TOT} \times d_{layer}}{A_{layer} \times k_{layer}} \quad (2)$$

Where $\Delta T_{upper-lower}$ is the temperature difference between the upper and the lower surface of a layer residing in the LED COB module, $P_{TOT}$ is the thermal power propagating through the individual layer, $d_{layer}$ the thickness of layer, $A_{layer}$ is the total surface area of the conducting layer and $k_{layer}$ is the thermal conductivity.

As an example, the junction temperature ($T_j$) of an LED die having a 1 mm by 1 mm dimension attached to an electrical tracking region on a typical Insulated Metal Substrate (IMS) COB having the same dimension is shown in Table 2. The calculation assumes that the ambient temperature is 25° C. and the heat sink attached to the metal substrate has a thermal resistance of 2.5° C./W while the power injected into the LED COB module is 5 W. It can be seen that the 7; for the LED reaches 464° C. which in operation will cause the LED to fail. This is detrimental to a typical LED lighting application.

If Table 2 is inspected, it is clearly seen that the largest temperature gradient is formed in the isolation layer 101. One method of reducing the temperature difference is to increase the active area $A_{layer}$. It is an object of the present invention to increase the area $A_{layer}$ while still maintaining maximum packing of an LED cluster, in order to provide the maximum brightness per unit area of LED module. High levels of brightness are important in applications where a small etendue is necessary, such as projectors and directional light applications.

TABLE 2

| Layer (no.) | k (W/m · K) | $P_{TOT}$ (W) | ΔT | Area (mm²) | Thickness (μm) | Lower surface temp (° C.) | Upper surface temp (° C.) |
|---|---|---|---|---|---|---|---|
| LED (107) | 50 | 5 | 0.02 | 1.0 | 0.20 | 463.80 | 463.82 |
| Die bond (106) | 29 | 5 | 0.71 | 1.0 | 5.00 | 462.94 | 463.80 |
| Tracking (109) | 400 | 5 | 0.36 | 1.0 | 35.00 | 462.50 | 462.94 |
| Isolation (101) | 2 | 5 | 310.00 | 1.0 | 150.00 | 87.50 | 462.50 |
| Substrate (100) | 200 | 5 | 41.32 | 1.0 | 2000.00 | 37.50 | 87.50 |
| Heat sink | | 5 | | | | 25.00 | 37.50 |

Typical methods of reducing the thermal resistance in a multiple cluster LED on COB is by arranging the array of LED die in a square or triangular lattice with each LED die having a finite separation distance between the neighbours. A known alternative common method of improving the thermal resistance of LED modules of the prior art is by reducing the thermal impedance vertically through the stack of material in the module.

In order to achieve higher brightness levels per unit light emission area it is common in LED modules of the prior art to increase the number of LED die arranged in a periodic array in the tightest footprint. However, due to LED efficiency droop at higher power drive and due to thermal de-rating effects there exists a compromise between the increase in the injected power density per LED die and the ability of the LED module to efficiently dissipate heat. Hence, the LED COB module of the present invention provides a means of optimally packing the LED die while allowing increased levels of power density injection, thereby allowing subsequently increased brightness from the same unit light emission area by means of efficiently spreading heat horizontally outwards.

The brightness of an LED module (sometimes termed the luminance of a LED module) is defined by the amount of light emitted from a particular area and that falls within a given solid angle, as follows:

$$L = \frac{d^2 F}{dA_{emission} d\Omega \cos\theta} \quad (3)$$

where L is the luminance (in cd/m$^2$), F is the luminous flux (termed the total emitted power), A$_{emission}$ is the total emission area bounded by all the LED die, $\Omega$ is the solid angle and $\theta$ is the angle formed between the surface normal and the specified direction. It can seen that reducing the total emission area, A$_{emission}$, and increasing the luminous flux, F, both contribute to increased brightness of the source.

Figure 2A:
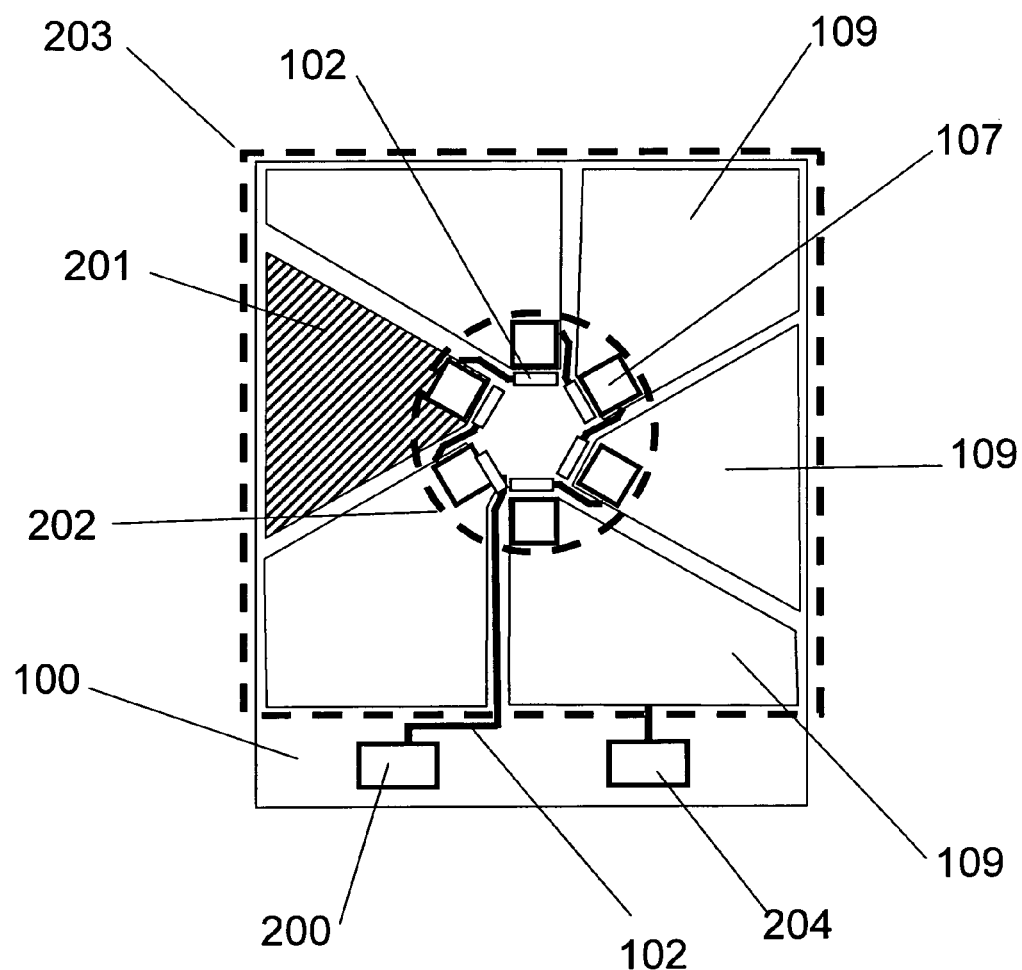
FIG. 2a shows a schematic plan view of a first example LED COB module of the present invention.

FIG. 2a shows a plan view of an example LED COB of the present invention, in which a cluster of six LED die is proposed. The six LED die are arranged radially having a finite spacing between each individual die to allow for an electrical track, typically ranging between 10 microns and 500 microns in width, to exist between the die. In the present example, the LED die may range in size between 1 mm by 1 mm and approximately 2.2 mm by 2.2 mm, but are not limited to these dimensions. Furthermore, the LED die may not be square, but have other aspect ratios. The electrical tracking layer 109 is also arranged radially to match the packing of the LED die. The LED die is attached to a large thermal conductive pad area 201, which also functionally forms part of layer 109.

The total surface area, A$_{pad}$, covered by each individual conduction pad 201 is designed to comprise an area at least 5 times larger than that of the LED die attached to it. As such, the area of each individual conduction pad must satisfy the following inequality:

$$\frac{A_{pad}}{\sum_m A_{LED}} \geq 5 \quad (4)$$

where A$_{LED}$ is the surface area of an individual LED die and m is the number of LED die attached to a given pad. A corollary to this is that the total combined area of all the conduction pads, which for the example of FIG. 2a is approximately defined by the dashed square 203, must also be at least 5 times greater than the combined total area occupied by all the LED die in the module.

In another criterion of the present invention, the minimum dimensions of the conductive pads 201 may not comprise of regions narrower than either the width or length of the LED die. This is designed to provide for improved horizontal heat spread and minimum thermal bottleneck.

In another feature of the present invention, the LED top surface contact pad makes an electrical contact with electrical track 102 and is preferably arranged such that the contact mechanism achieved via wire bonding or other technique is formed radially inwards towards the centre of the light emission region and allowing the outside region for the formation of the conduction pad and ohmic contact with the bottom surface of the LED die.

Due to the high thermal conductivity of layer 109, the increase in surface area of at least 5 times improves the heat spread horizontally by 5 times across the thickness of the electrical track (which is typically 35 microns of Cu) and hence dissipates the heat across a much larger effective area, when compared with the light emission area. This is shown in Table 3, whereby the Cu electrical tracking comprises a 5 times larger surface area:

TABLE 3

| Layer (no.) | K (W/m · K) | P$_{TOT}$ (W) | ΔT | Area (mm$^2$) | Thickness (μm) | Lower surface temp (° C.) | Upper surface temp (° C.) |
|---|---|---|---|---|---|---|---|
| LED (107) | 50 | 5 | 0.02 | 1.0 | 0.20 | 55.38 | 55.40 |
| Die bond (106) | 29 | 5 | 0.71 | 1.0 | 5.00 | 54.52 | 55.38 |
| Tracking (109) | 400 | 5 | 0.36 | 5.0 | 35.00 | 54.50 | 54.52 |
| Isolation (101) | 2 | 5 | 310.00 | 5.0 | 150.00 | 39.50 | 54.50 |
| Substrate (100) | 200 | 5 | 41.32 | 5.0 | 2000.00 | 37.50 | 39.50 |
| Heat sink | | 5 | | | | 25.00 | 37.50 |

The dramatic decrease in T$_j$ for the LED COB of the present invention, as compared to the prior art LED COB of Table 1, allows the junction temperature of the LED to operate at 55° C. This is well within the recommended 100-110° C. maximum operating temperature of an LED in order to enable a lifetime of over 50,000 hour and also gives rise to an LED COB thermal resistance of 3.6K/W (from LED junction to base of LED COB module), as compared to 85.3K/W for the example detailed in Table 1.

In the present example, where the substrate has lateral dimensions of width 35 mm by length 35 mm, the approximate total surface area of the substrate is 1225 mm$^2$. It is noted that the total light emission area, as defined by the area 202 bounded by all the LED die residing on the COB, is approximately 11 mm$^2$. This is, therefore, much smaller than the total LED COB module size and no more than 4 times larger than the total combined LED active emission areas.

The configuration of the present example therefore satisfies another criterion of the present invention, namely that the total emission area A$_{emission}$, 202, bounded by all the LED die should be no greater than four times the combined total surface area of all the LED die in the module. This criterion may be expressed by the following inequality:

$$\frac{A_{emission}}{\sum_n A_{LED}} \leq 4 \quad (5)$$

where $A_{LED}$ is again the surface area of an individual LED die and n is the total number of LED die in the module.

It is an object of the present invention that multiple concentric radial packing of LED die is employed rather than regular square or triangular array of LED die of the prior art. A LED COB of the prior art, having a regular array of more than six LED die, cannot satisfy the inequalities (4) and (5), respectively. In order for the LED COB of the prior art to satisfy the inequality (4), the emission area needs to be enlarged, but as indicated by equation (3), this would adversely affect the brightness of the product, as the emission area is increased. In the case of an LED COB module of the present invention, equations (4) and (5) are satisfied by extending the conduction pads radially outwards and concentrating the LED die centrally.

Figure 2B:
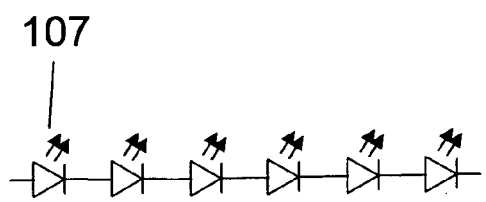

By electrically connecting the conductive pads and 102 to the ohmic contacts of the LED die, as shown in FIG. 2a, the LED die are electrically arranged in series as shown in FIG. 2b. The main n-contact is identified by 200 and the main p-contact for the LED COB module is identified by 204.

Figure 2C:
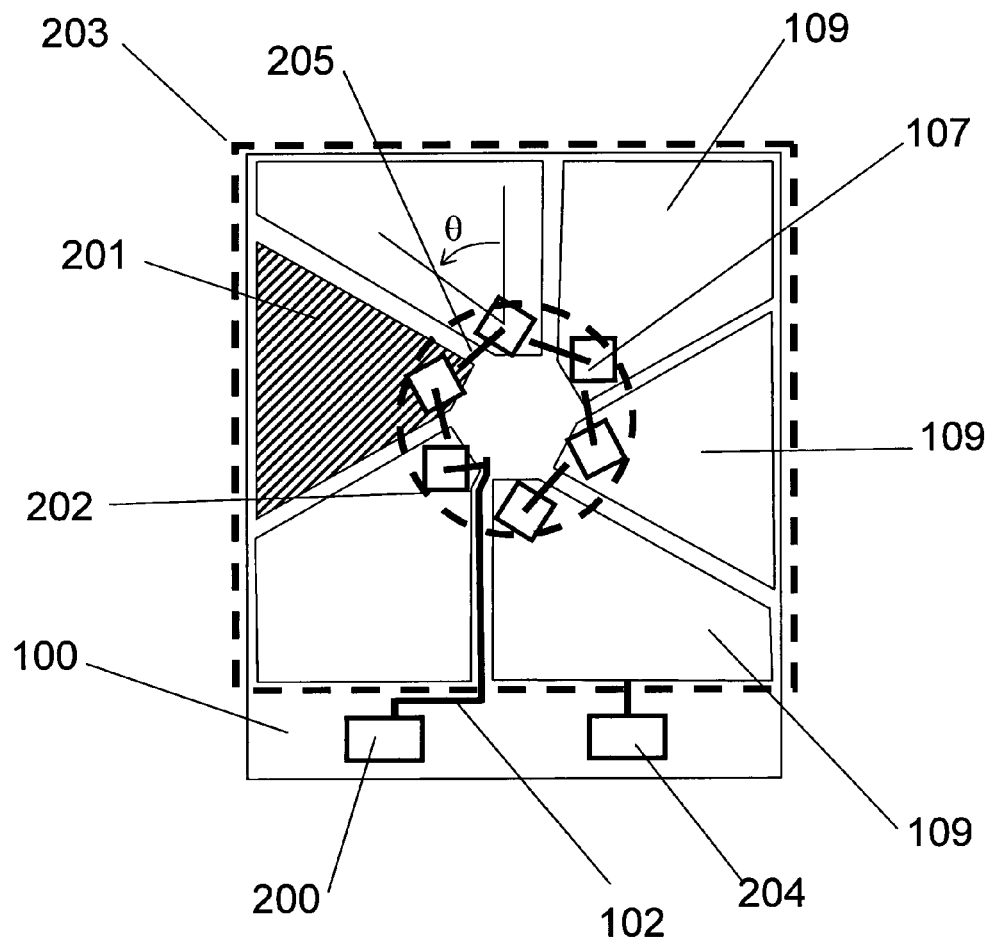
FIG. 2c shows a schematic plan view of a second example of a LED COB module of the present invention.

In another feature of the present invention, the LED top surface contact pad makes a direct electrical contact, as shown by 205, with the conductive pad, 201, associated with a neighbouring LED die, as shown in FIG. 2c. The LED die may additionally be arranged such that they are affixed to pad 201 with a predefined rotational orientation, θ, with respect to the centre of the LED die. This rotational angle may be beneficial during wire bonding whereby regions are created in the vicinity of the LED die to facilitate wire bonding.

Figure 3A:
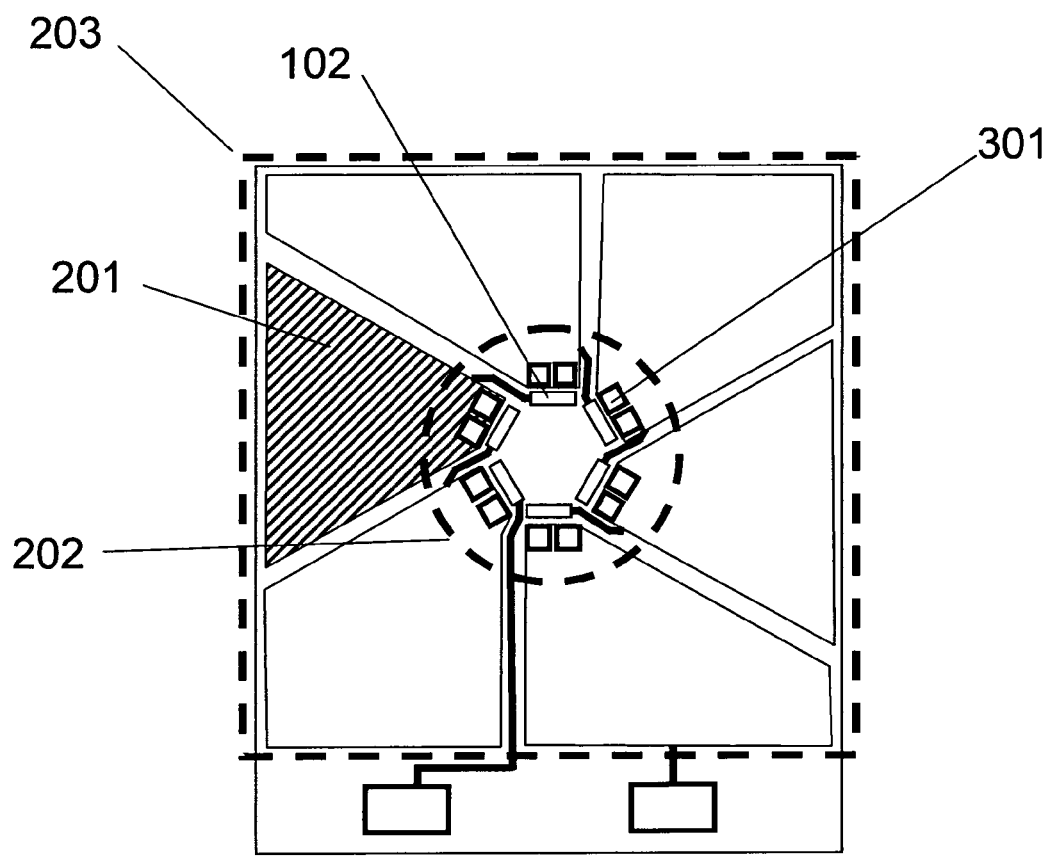
FIG. 3a shows a schematic plan view of a third example of a LED COB module of the present invention.
Figure 3B:
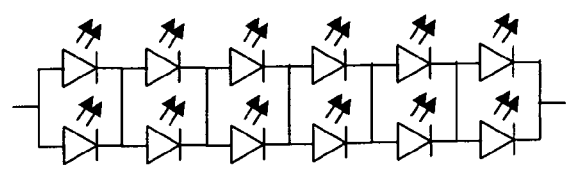

In another radial arrangement of a cluster of 12 LED die, as shown in FIG. 3a, each conductive pad 201 is further designed to simultaneously allow the attach of 2 individual LED die, 301. The inequalities (4) and (5) are still satisfied and in the present example the minimum dimensions of the conductive pads 201 may not comprise of regions narrower than twice the width or length of the LED die. The application of a similar series connection of the conductive pads as applied in FIG. 2a gives rise to a more complex six-series two-parallel arrangement of LED die as shown in FIG. 3b. Each pair of LEDs is simultaneously attached to a common pad 201 and hence forms a parallel electrical connection.

Figure 4A:
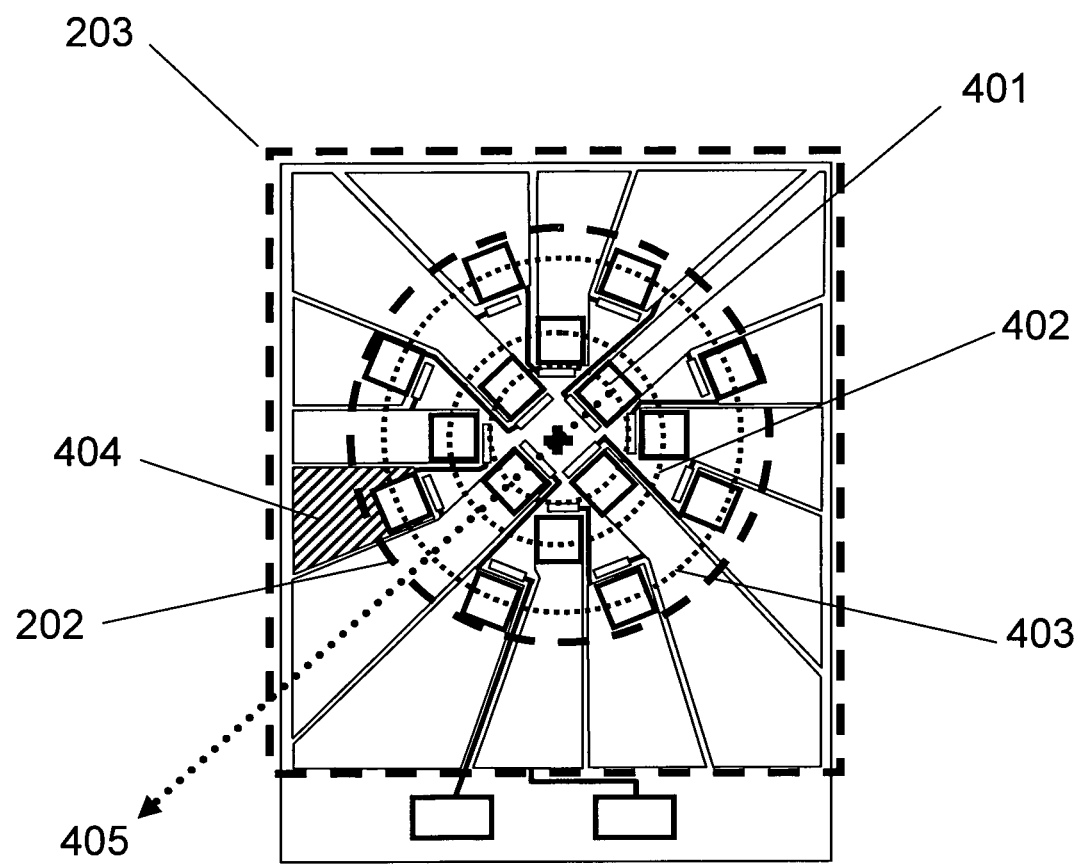
FIG. 4a shows a schematic plan view of a first example LED COB module in a variant of the present invention.

In another variant of the present invention, a larger number of LED die greater than six are arranged in a concentric radial fashion. Preferably, there are greater than or equal to 6 LED die, more preferably greater than 7, still more preferably greater than 15, and most preferably greater than 33 LED die. In the first example of this variant of the present invention, three concentric radial arrangements of LED die are formed, as shown in the plan view of FIG. 4a.

The first radial arrangement, having the smallest radius and denoted by the dotted line 401, comprises four LED die arranged with rotational symmetry and without the LED die or at least one electrical track 102 associated with each LED die overlapping. The initial seed number of LED die forming the first radial arrangement is arbitrary but is preferably greater than or equal to three, more preferably at least six and still more preferably at least eight. In the present example, the radius of the first LED die arrangement is approximately 1.4 mm for 1 mm by 1 mm LED die. This dimension is in order to accommodate a single electrical track of 200 microns and a further 200 microns of spacing between the LED die and the track. In the present example, the LED die orientation is rotated so that the normal to the surface of the outer LED facet edge is aligned to the normal formed on the surface of the construction circle 401.

As indicated by dotted line 402, a subsequent concentric radial arrangement of LEDs, having a larger radius, is superimposed on the first arrangement. In order to satisfy the criterion for the conductive pad 404, a radially outward expanding pad having a minimum width equal to or greater than the LED dimension with a minimum area of five times that of the LED die is designed. In a further feature of this variant of the present invention, the LED die in the second radial arrangement, 402, are located so as to be displaced azimuthally from any other die. That is to say, any radially-outward projecting construction line (e.g. as shown by dotted arrow 405) which runs from the centre of the radial construction rings (indicated by the solid cross) and the centre of any LED die residing in the cluster does not coincide with any other neighbouring LED die.

The LED die in any subsequent third, 403, or fourth or other greater radial arrangement must satisfy similar conditions, whereby in the final completed LED COB module the LED die packing is designed such that any radially-outward projecting construction line, 405, from the centre of the LED cluster and passing through any LED die centre does not coincide with any another LED die.

Figure 4B:
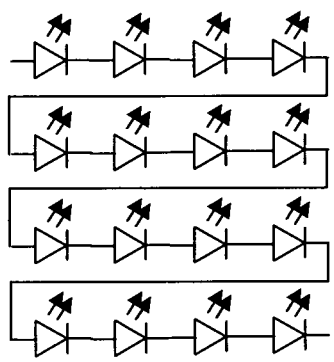

In the present example, the electrical tracking is formed in a similar fashion to the example shown in FIG. 2a, giving rise to an array of sixteen LED die arranged electrically in series, as shown in FIG. 4b.

Figure 5A:
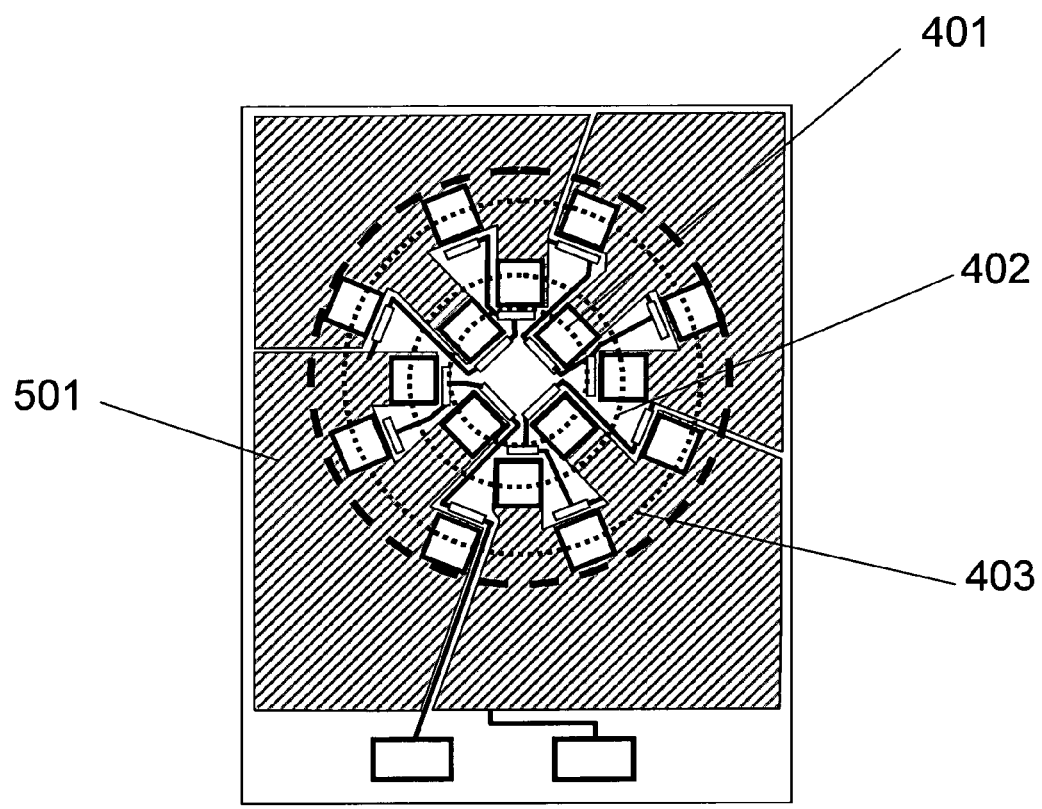
FIG. 5a shows a schematic plan view of a second example LED COB module of the variant of the present invention.
Figure 5B:
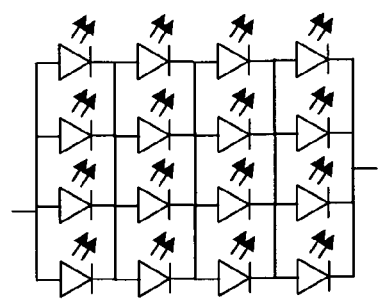

FIG. 5a shows a second example of this variant of a LED COB module, wherein multiple LED die of the same or different radial arrangements are electrically and thermally affixed to a common conductive pad, 501. In the present example, a single LED from the first and second radial arrangement, and two further LEDs from a third radial arrangement, are allowed to share a common conductive pad 501. This gives rise to an array of four sets of four parallel LED die, electrically arranged in series as shown in FIG. 5b. This arrangement is advantageous, whereby if a single LED die fails (the failure mechanism of a LED die being to short circuit) a maximum of only a quarter of the LEDs will no longer be supplied with power and the remaining 12 LEDs will resume normal operation. In another benefit of this circuit layout, the total voltage required across the complete 16 LEDs is approximately 14V, rather than the 56V that would be required, if all the LED die were arranged in series. This simplifies LED driver arrangements, where step down or buck constant current drivers may be employed.

Figure 5C:
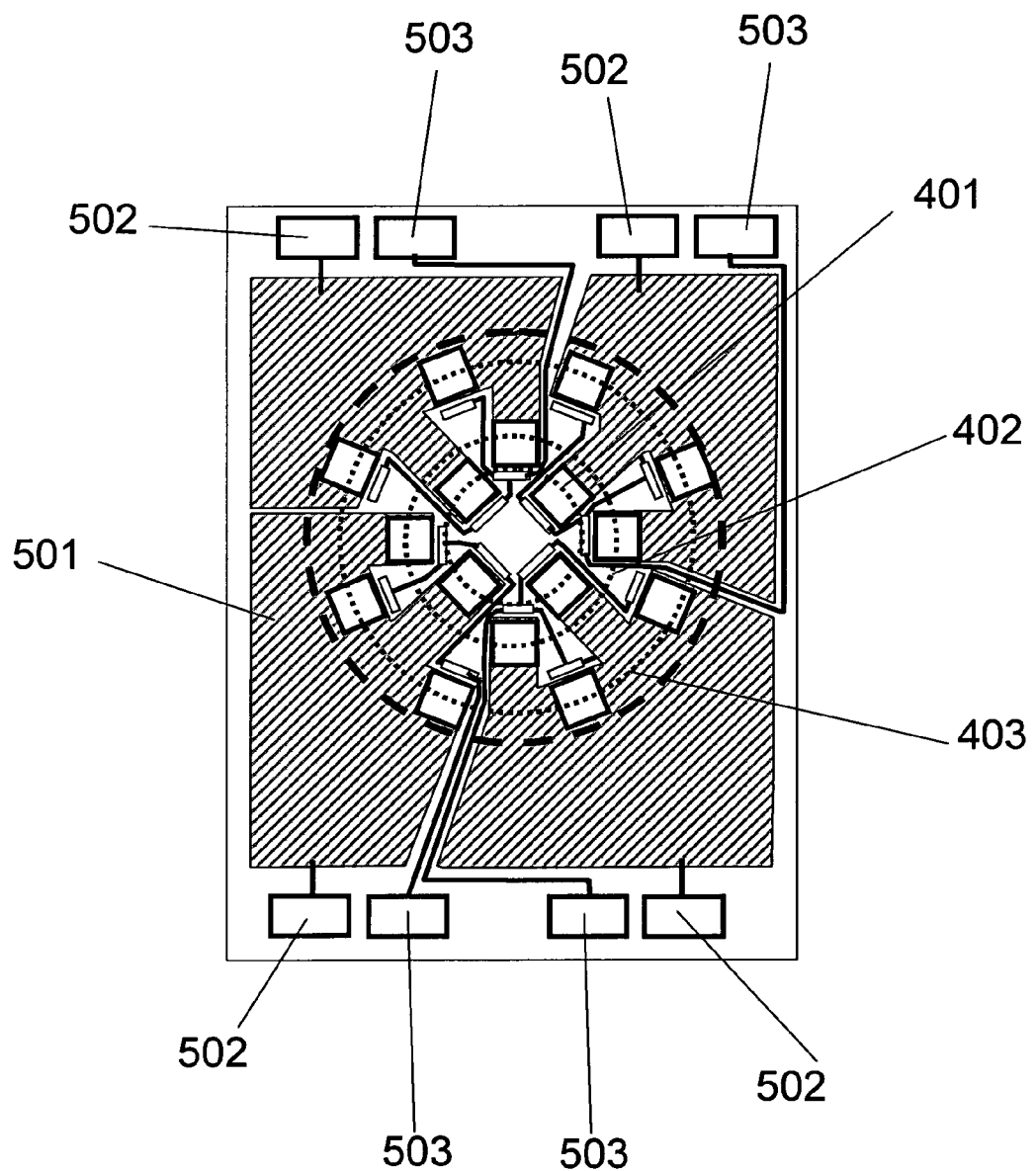
FIG. 5c shows a schematic plan view of a third example LED COB module of the variant of the present invention.

In a further feature of the present invention, multiple n-contact pads, 503, and p-contact pads, 502 may be formed on the LED COB module, as shown in FIG. 5c. The multiple n- and p-contact pads are electrically connected to specific groups of LED die. In the present example, a set of four LED strings having a series of four LED die are formed. The LED COB module contains a total of 16 LED die. This provides the ability to individually address specific groups of LED die and allow activation without the need to activate the combined LED die cluster simultaneously on the module.

The LED die residing in the LED COB module may comprise of semiconductor LEDs having different or similar emission wavelengths. Alternatively, or in addition, a wavelength converting element (WCE) or multiple elements may also be disposed on the surface of some or all the LED die. The WCE may comprise a phosphor or Quantum Dots, or any other suitable wavelength converting mechanism.

In a further example, the LED die may include optical components such as, but not limited to, reflector cups or light pipes affixed to the substrate to allow for collimation or LED die light mixing. Each LED die may reside in an individual cup or multiple LED may reside in the same reflector cup. In another variant of the invention, further secondary optics may also be included, such as shaped or textured plastic, glass or polymer optics, in order to achieve more complex tailored far field emission profiles.

In a further advantage of the present invention, the placement of the multiple LED die on radial concentric circles subject to the above mentioned packing criteria further provides improvement in the reduction of far field optical artifacts and the breaking up of any symmetrical optical modes that may arise during light emission from regular periodic arrays of LED modules. This advantage is especially relevant when secondary collimation or re-direction optical components are coupled to the LED COB module of the present invention, as compared to those of the prior art.

In a final aspect of the present invention a method of manufacture of a LED COB module is proposed. The preferred steps are as follows:

(a) A number of LED die for packing on an LED COB is defined.

(b) A concentric radial arrangement of LED die satisfying the non-overlapping construction line criteria is designed.

(c) An electrical tracking layout is defined, which satisfies both the concentric radial LED arrangement and the inequalities (4) and (5).

(d) A high thermal conductivity electrical board is provided having an electrical isolation layer and the electrical tracking layer that has been designed is disposed on the top surface of the isolation layer. This step may be formed by a technique such as but not limited to screen printing, electrodeposition, sputtering and evaporation.

(e) The LED die cluster is affixed to the conduction pads of the individual tracking layers to provide thermal and electrical conduction paths.

(f) Top contact pads on each LED are subsequently connected to electrical tracks on the IMS board in order to form an electrical circuit. The top contacts and the tracking may be connected by a method such as wire bonding or by the introduction of a passivation layer and the sputtering of metal tracks through a shadow mask.

In addition to the above steps, the LED die cluster may be further encapsulated to protect the LED COB module from the environment. A WCE element may subsequently be disposed on the top surface of the LED die. Prior to encapsulation, a reflector cup system may be attached to the substrate, such that each LED die resides inside the reflector cup or cups.

The invention claimed is:

1. A LED Chip-on-Board (COB) module comprising:
a high thermal conductivity substrate;
an electrical isolation layer disposed on an upper surface of the substrate;
an electrical-tracking layer disposed on an upper surface of the electrical isolation layer and having a plurality of thermal conduction pads; and,
a plurality of LED die, including at least six LED die, disposed on the electrical-tracking layer, each of the plurality of thermal conduction pads having at least one of the plurality of LED die attached thereto,
wherein:
each thermal conduction pad has lateral dimensions at least as large as the combined lateral dimensions of the LED die attached to it and the total surface area of each thermal conduction pad is at least five times the total surface area of all the LED die attached to said thermal conduction pad;
the plurality of LED die are arranged in one or more radially concentric rings about a centre point such that each LED die is azimuthally offset from neighbouring LED die, all of the plurality of LED die being completely within an outer boundary, which defines a total light emission area of the plurality of LED die when activated; and,
said total light emission area is no greater than four times larger than the combined total surface emission area of all the individual LED die disposed on the substrate electrical-tracking layer.

2. A module according to claim 1, wherein the plurality of LED die comprises at least fifteen LED die.

3. A module according to claim 1, wherein the plurality of LED die comprises at least thirty three LED die.

4. A module according to claim 1, wherein the plurality of LED die comprises at least two LED die affixed to the same thermal conduction pad.

5. A module according to claim 4, wherein the plurality of LED die comprises at least six pairs of LED die arranged in a single concentric ring.

6. A module according to claim 1, wherein the plurality of LED die comprises at least sixteen LED die arranged in three concentric rings.

7. A module according to claim 1, wherein the plurality of LED die are arranged in a plurality of radially concentric rings and a plurality of neighbouring LED die are attached to regions of a common thermal conduction pad which extend radially inwards by differing amounts.

8. A module according to claim 1, wherein each LED die is rotated about its axis by a pre-defined rotational symmetry angle relative to a radial line extending from the centre point of the one or more concentric radial rings and through the centre of the LED die.

9. A module according to claim 1, wherein the high thermal conductivity substrate comprises a material selected from a group which includes Copper, Copper alloy, Copper Tungsten, Aluminium, AlN, Aluminium Oxide, Silicon Carbide, Carbon Fibre or composites, and graphite.

10. A module according to claim 1, wherein the electrical tracking layer comprises one or more material materials selected from a group which includes Copper, alloys of Copper, Ag, Ag alloys, Au, Au alloys, W, Ni, Ti and Aluminium.

11. A module according to claim 1, wherein the module further comprises one or more pairs of electrical contact pads disposed on the substrate and connected to the electrical tracking layer, wherein upon activation each pair of contact pads activates a predefined group of LED die.

12. A module according to claim 1, wherein the LED die are electrically connected in series.

13. A module according to claim 1, wherein groups of LED die are electrically connected in parallel, each group comprising a plurality of LED die electrically connected in series.

14. A module according to claim 1, wherein the electrical tracking layer comprises at least two regions electrically isolated from one another.

15. A module according to claim 1, wherein the module further comprises an encapsulant disposed on the surface of the LED die.

16. A module according to claim 1, wherein the module further comprises a wavelength converting element (WCE) at least partially disposed on the surface of the LED die.

17. A module according to claim 1, wherein the module further comprises a reflector cup affixed to the surface of the substrate with the LED die arranged to reside inside the reflector cup.

18. A method of manufacturing a LED COB module comprising the steps of:

providing a high thermal conductivity substrate having an electrical isolation layer disposed on an upper surface of the substrate;

pre-determining a concentric radial arrangement of a plurality of LED die, including at least six LED die, wherein:

the plurality of LED die are arranged in one or more radially concentric rings about a centre point such that each LED die is azimuthally offset from neighbouring LED die, all of the plurality of LED die being completely within an outer boundary, which defines a total light emission area of the plurality of LED die when activated; and, said total light emission area is no greater than four times the combined total surface emission area of all the individual LED die in the plurality;

pre-determining an electrical tracking layout having thermal conduction pads, wherein:

each thermal conduction pad has lateral dimensions at least as large as the combined lateral dimensions of the LED die to be attached to it and the total surface area of each thermal conduction pad is at least five times the total surface area of all the LED die to be attached to said thermal conduction pad;

forming the pre-determined electrical tracking layout having the thermal conduction pads on an upper surface of the electrical isolation layer;

attaching the plurality of LED die to the thermal conductions pads according to the pre-determined concentric radial arrangement; and, connecting a top contact pad of each LED die to the electrical tracking or thermal conduction pad.

* * * * *